(12) United States Patent
Bang et al.

(10) Patent No.: US 10,615,792 B2
(45) Date of Patent: Apr. 7, 2020

(54) PROXIMITY SENSOR

(71) Applicant: Elliptic Laboratories AS, Oslo (NO)

(72) Inventors: Hans Jørgen Bang, Oslo (NO); Ståle A. Skogstad, Oslo (NO)

(73) Assignee: ELLIPTIC LABORATORIES AS, Oslo (NO)

( * ) Notice: Subject to any disclaimer, the term of this patent is extended or adjusted under 35 U.S.C. 154(b) by 0 days.

(21) Appl. No.: 15/770,290

(22) PCT Filed: Oct. 21, 2016

(86) PCT No.: PCT/GB2016/053306
§ 371 (c)(1),
(2) Date: Apr. 23, 2018

(87) PCT Pub. No.: WO2017/068372
PCT Pub. Date: Apr. 27, 2017

(65) Prior Publication Data
US 2018/0323783 A1    Nov. 8, 2018

(30) Foreign Application Priority Data

Oct. 22, 2015 (GB) .................................. 1518761.0

(51) Int. Cl.
| G06F 3/041 | (2006.01) |
| H03K 17/945 | (2006.01) |
| G01S 15/04 | (2006.01) |
| G06F 3/043 | (2006.01) |

(52) U.S. Cl.
CPC ............ *H03K 17/945* (2013.01); *G01S 15/04* (2013.01); *G06F 3/043* (2013.01); *G06F 2203/04108* (2013.01)

(58) Field of Classification Search
None
See application file for complete search history.

(56) References Cited

U.S. PATENT DOCUMENTS

| 2003/0146673 | A1 | 8/2003 | Toda et al. | |
| 2011/0148798 | A1 | 6/2011 | Dahl | |
| 2012/0299820 | A1* | 11/2012 | Dahl | G06F 3/011 345/156 |
| 2013/0154919 | A1* | 6/2013 | Tan | G06F 3/017 345/156 |
| 2014/0035836 | A1* | 2/2014 | Cui | G06F 3/0421 345/173 |

OTHER PUBLICATIONS

International Search Report and Written Opinion dated Feb. 10, 2017 from International Application No. PCT/GB2016/053306.

* cited by examiner

*Primary Examiner* — Carl Adams
(74) *Attorney, Agent, or Firm* — Beyer Law Group LLP

(57) ABSTRACT

An electronic device (202) includes an ultrasonic proximity sensor arrangement comprising an ultrasonic transmitter (4) and an ultrasonic receiver (6) recessed from a front surface (208) of the device. A barrier (218) extends between the transmitter and receiver in the direction of the front surface of the device. The ultrasonic proximity sensor arrangement is arranged to determine proximity of an object (16) to said front surface based on a signal (214) received by the ultrasonic receiver, wherein the received signal is a reflection from said object of a signal transmitted from the ultrasonic transmitter.

23 Claims, 11 Drawing Sheets

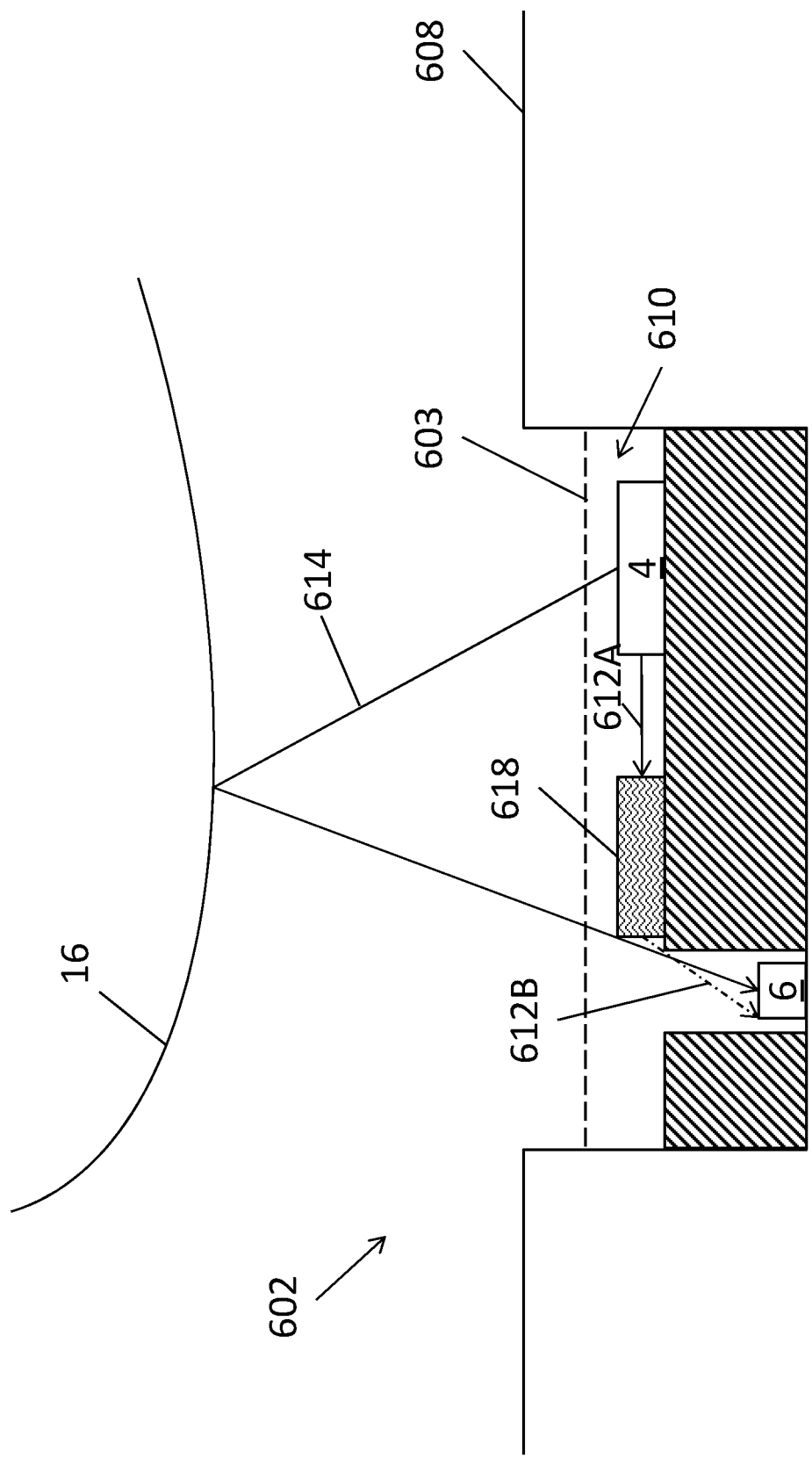

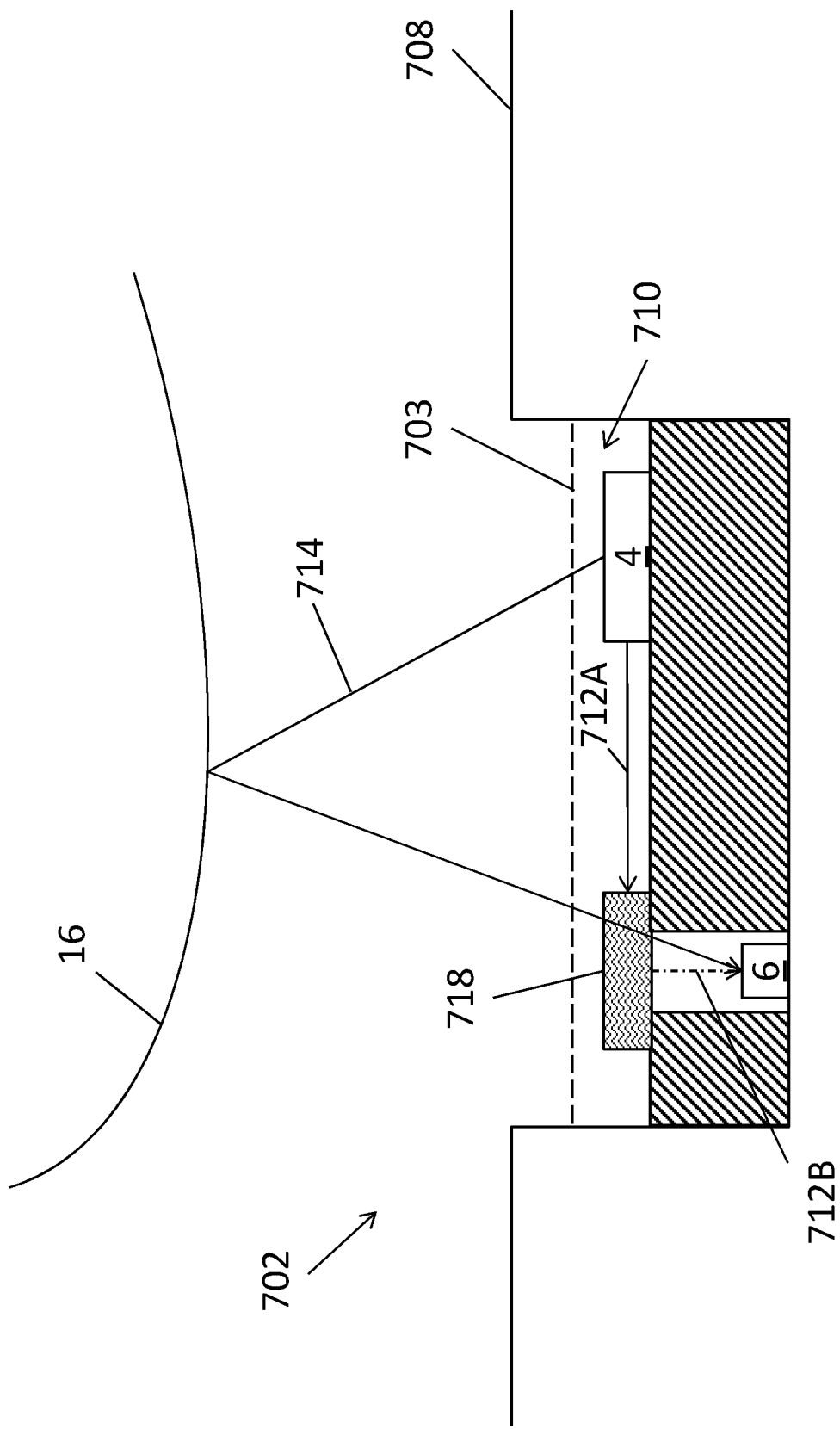

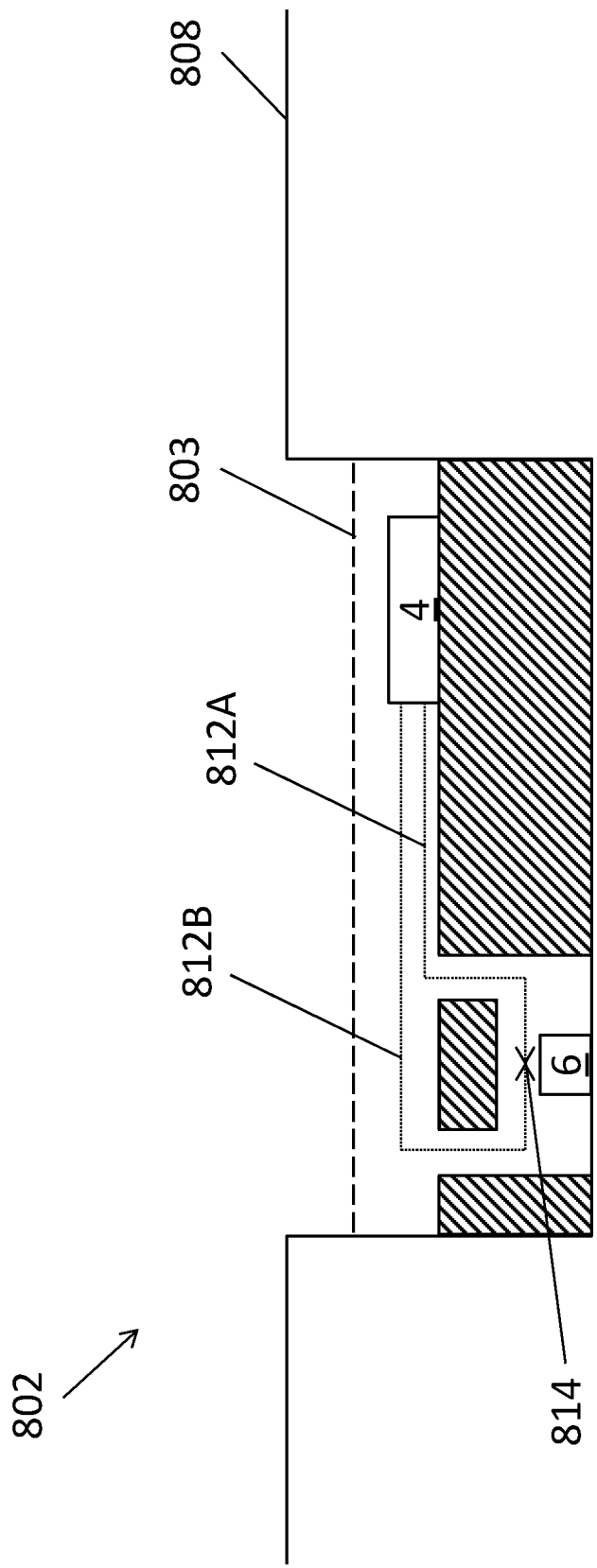

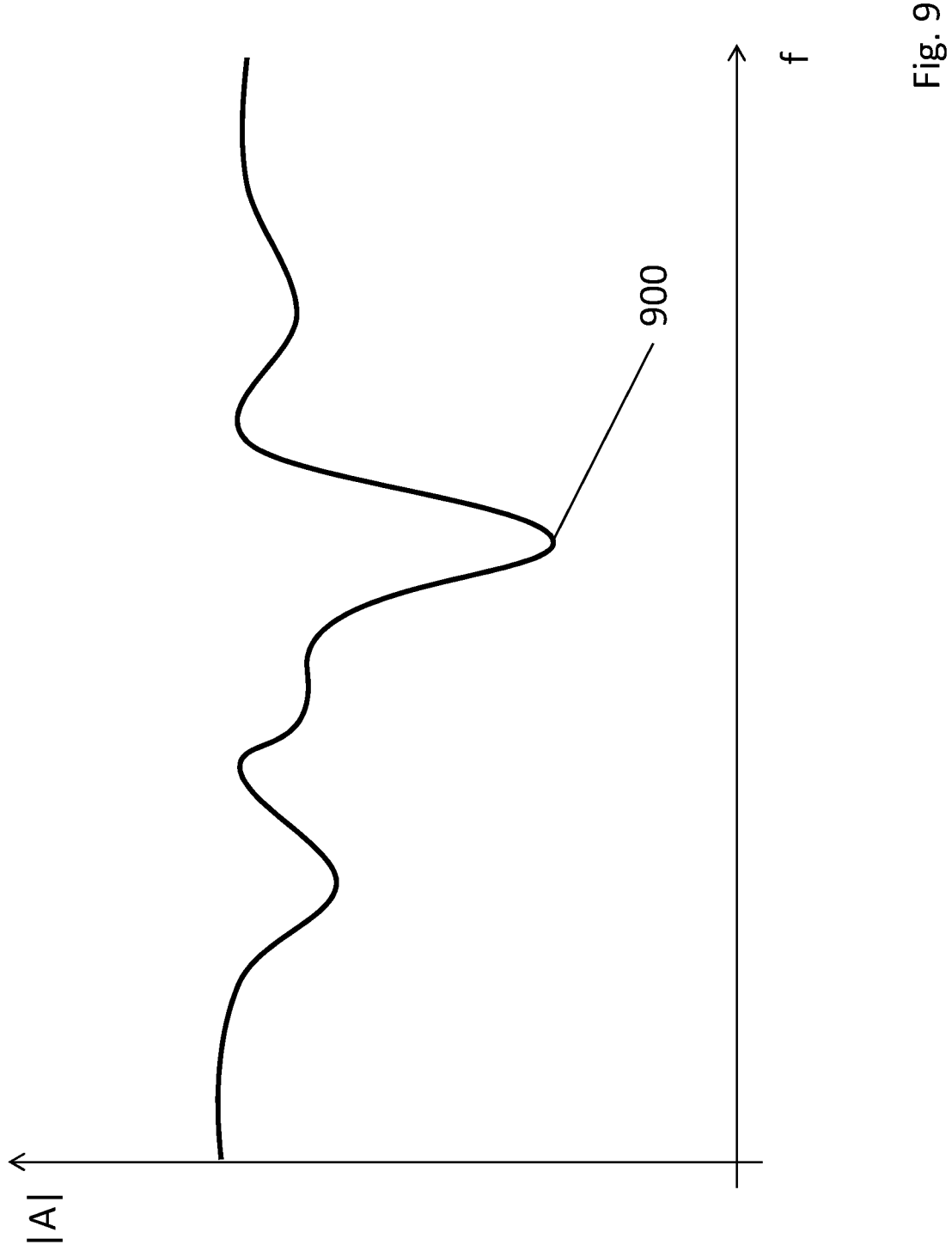

PROXIMITY SENSOR

This invention relates to proximity sensors, particularly ultrasonic proximity sensors incorporated within electronic devices, particularly handheld electronic devices.

Modern electronic devices, particularly portable devices such as smartphones, tablets and wearable technology such as smartwatches often include a proximity sensor that can be used to determine how close an object such as a user's head or hand is to the device.

This functionality is useful in many applications. By way of example only, such a proximity sensor may be useful to enable the touchscreen of a smartphone to be dimmed and made to ignore inputs if the smartphone is being held next to a user's head, thus preventing erroneous inputs such as accidentally hanging up during a telephone call.

Some proximity sensors utilise optical sensing arrangements, using e.g. infrared light to determine whether an object is near the device. An alternative approach uses ultrasonic signals reflected from the object to determine whether the object is proximate to the device. Ultrasonic proximity sensors usually possess greater range and efficiency characteristics when compared to their infrared counterparts, as well as working irrespective of the colour or surface texture of the object to be detected. Such ultrasonic proximity sensors can also use existing ear-piece speakers and microphones in devices such as smartphones, i.e. they do not necessarily require dedicated hardware as is the case with infrared sensors. However the Applicant has appreciated shortcomings in existing designs which the present invention seeks to address.

When viewed from a first aspect, the present invention provides an electronic device having a front surface and including an ultrasonic proximity sensor arrangement comprising:

an ultrasonic transmitter recessed from a front surface of the device; and an ultrasonic receiver recessed from the front surface of the device; and a barrier extending between the transmitter and receiver in the direction of the front surface of the device, the ultrasonic proximity sensor arrangement being arranged to determine proximity of an object to said front surface based on a signal received by the ultrasonic receiver, wherein the received signal is a reflection from said object of a signal transmitted from the ultrasonic transmitter.

Thus it will be appreciated by those skilled in the art that in accordance with the present invention there is provided a proximity sensor that having a barrier which helps to attenuate ultrasonic signals travelling directly from the transmitter to the receiver (the so called "direct path") while allowing indirect signals that are reflected from the object to propagate from the transmitter to the receiver relatively uninhibited. This improves the certainty with which the proximity sensor can determine that received ultrasonic signals are indeed reflections from the object and not direct path signals that have simply travelled directly from the transmitter. Advantageously, the proximity sensor of the present invention can be of a compact form factor, wherein the ultrasonic transmitter and receiver can be located in relatively close proximity when compared with conventional ultrasonic proximity sensors. Significantly it may not be necessary to provide two separate apertures in different places. The Applicant has further appreciated that being able to mitigate the effect of the direct path signal in ultrasound proximity sensors is beneficial in allowing the same microphone and speakers as are used for audible purposes where speakers and microphones are often located physically close to one another to facilitate active noise cancellation.

While in some embodiments the barrier extends to the front surface of the device, in an alternative set of embodiments the device further comprises a gap between the front surface of the device and the barrier. By providing a gap between the barrier and the front surface of the device, it increases the chance that a reflected signal will be received by the ultrasonic receiver. Without such a gap, it is possible for an object such as the user's cheek pressed against the front surface of the device to completely block the path of the ultrasonic signals. However, in instances where the barrier does extend to the front surface of the device, it may still be possible to determine proximity of the object by the absence of reflected signals at the ultrasonic receiver—particularly if this occurs shortly after an object was detected quite close and/or with a reducing distance.

It will be appreciated that there are a number of ways of utilising the reflected signals received by the ultrasonic receiver to determine the proximity of an object. In some embodiments, the ultrasonic proximity sensor arrangement is arranged to determine proximity of an object using a measured time of flight between the signal transmitted from the ultrasonic transmitter and the signal received by the ultrasonic receiver after reflection from said object. The closer the object is to the device, the shorter the distance the ultrasonic signals must travel and thus the time of flight is decreased. If there is no object proximate to the device, the time of flight will be relatively long, as it is likely that the first reflections received will be from the surroundings.

Additionally or alternatively, the ultrasonic proximity sensor arrangement may be arranged to determine proximity of an object using a difference between a signal strength of the transmitted signal and a measured signal strength of the received signal. If the reflected ultrasonic signals have travelled a relatively short distance due an object being proximate to the device, they will not have been subject to the same degree of attenuation as received ultrasonic signals that have been reflected from further objects.

Additionally or alternatively, rather than comparing the transmitted and received signals, the ultrasonic proximity sensor arrangement may be arranged to determine proximity of an object using a difference between consecutive received signals. By way of non-limiting example this could be a difference in signal strength or phase.

It will be appreciated by those skilled in the art that the present invention requires only that the barrier be present in order to reduce the impact of a direct signal path between the ultrasonic transmitter and receiver. However, in a particular set of embodiments, the barrier comprises a solid barrier. The term "solid barrier" will be understood to mean that the barrier acts substantially to block the ultrasonic signals from passing therethrough, or at least to have an attenuation factor of at least 95% compared to free air.

In an alternative set of embodiments, the barrier comprises an acoustically attenuating material. Such a material would attenuate ultrasonic signals to a greater extent than free air but not to the same extent as a solid barrier. In some such embodiments, reflected signals have a shorter path through the material than signals that travel from the transmitter to the receiver without being reflected from said object. This advantageously causes signals that travel directly from the transmitter to the receiver to be attenuated by a greater amount than signals that have travelled via an indirect path during which they have been reflected by the object. This enhances the signal to noise ratio (SNR) of the desired reflected signals where the direct path signals can be considered a strong source of "noise". Further advantageously, such an acoustically attenuating material is acoustically absorbent. This could, by way of example only, comprise an acoustically attenuating fabric. This reduces the amount of undesirable reflection compared to a solid barrier. Additional reflections—e.g. within the cavity—are undesirable as they may interfere with the desired signals that are reflected by the external object.

While the transmitter and receiver may be directly exposed to the device's surroundings, in some embodiments the proximity sensor comprises an acoustically porous layer positioned above the ultrasonic transmitter and the ultrasonic receiver. This acoustically porous layer may for example comprise a mesh or grille that extends over the recessed compartment in which the transmitter and receiver are disposed. This protects the transmitter and receiver from damage and from collecting too many small particles such as dust. In some such embodiments, the acoustically porous layer is flush with the front surface of the device. However in an alternative set of embodiments, the acoustically porous layer is recessed from the front surface of the device. This automatically provides the gap between the barrier and the front surface of the device present in a set of embodiments. The recessed acoustically porous layer may thus help to prevent the indirect signal path from being completely blocked.

Typically the transmitter and receiver may be disposed in a common compartment recessed form the front surface although in some embodiments, the transmitter and receiver are positioned respectively in first and second sub-compartments. This mutual compartmentalisation of the transmitter and receiver further prevents direct signals travelling therebetween, further improving the certainty with which the proximity sensor can determine that received ultrasonic signals are reflections from the object. In such embodiments, the recited barrier comprises the adjacent walls of the respective sub-compartments. The sub-compartments may be at least partially covered by a common acoustically porous layer member.

In a set of embodiments, the receiver is recessed further from the front surface of the device than the transmitter, forming a channel in which the ultrasonic receiver is positioned. This further reduces the impact of signals travelling directly from the transmitter to the receiver and enhances the reception of ultrasonic signals reflected by the object. Advantageously, the channel comprises two discrete signal paths with first and second different lengths, the difference between the first and second lengths being chosen to attenuate direct signals. It will be appreciated by those skilled in the art that the same benefit may be achieved by arrangements in which the transmitter is recessed further from the front surface of the device than the receiver, forming a channel in which the ultrasonic transmitter is positioned.

This is novel and inventive in its own right and thus when viewed from a second aspect, the present invention provides an electronic device having a front surface and including an ultrasonic proximity sensor arrangement comprising:
  an ultrasonic transmitter recessed from the front surface;
  an ultrasonic receiver recessed from the front surface;
the ultrasonic proximity sensor arrangement being arranged to determine proximity of an object to said front surface based on a signal received by the ultrasonic receiver, wherein the received signal is a reflection from said object of a signal transmitted from the ultrasonic transmitter;
the ultrasonic proximity sensor arrangement further comprising a structure disposed in front of the receiver defining at least first and second discrete signal paths having different path lengths such that signals travelling from the transmitter without passing the front surface to the receiver via the first and second paths undergo a destructive interference which is greater than a destructive interference undergone by signals travelling from the transmitter to the receiver after reflection from the object.

Similarly, when viewed from a third aspect the present invention provides an electronic device having a front surface and including an ultrasonic proximity sensor arrangement comprising:
  an ultrasonic transmitter recessed from the front surface;
  an ultrasonic receiver recessed from the front surface;
the ultrasonic proximity sensor arrangement being arranged to determine proximity of an object to said front surface based on a signal received by the ultrasonic receiver, wherein the received signal is a reflection from said object of a signal transmitted from the ultrasonic transmitter;
the ultrasonic proximity sensor arrangement further comprising a structure disposed in front of the transmitter defining at least first and second discrete signal paths having different path lengths such that signals travelling from the transmitter without passing the front surface to the receiver via the first and second paths undergo a destructive interference which is greater than a destructive interference undergone by signals travelling from the transmitter to the receiver after reflection from the object.

In a set of embodiments of the second or third aspects, the difference between the first and second lengths is substantially equal to an odd integer multiple of half the wavelength of the signal transmitted from the ultrasonic transmitter. It will be appreciated that while the ultrasonic signals will likely have some finite bandwidth, the term "the wavelength of the signal" is to be understood to mean the dominant wavelength of the signal. By having a half-wavelength difference between the two signal paths, ultrasonic signals travelling directly from the transmitter to the receiver will be subject to destructive interference at the nodal point where the two signal paths meet at the receiver. However, indirect signals such as those being reflected by the object will generally not have this half wavelength difference between signals that enter the receiver via the two signal paths and thus will not be subject to the same amount of destructive interference. The Applicant has appreciated that this provides a microphone structure with frequency-dependent directivity. This is particularly advantageous in embodiments such as smartphones where the earpiece speaker and microphone used for regular calls etc. may be used as the ultrasonic transmitter and receiver respectively. In such embodiments, the advantages of attenuating direct ultrasonic signals are still achieved while regular audio applications such as calls that utilise audible frequencies are not noticeably altered.

The Applicant has appreciated that by introducing a structure which gives rise to different path lengths, signals travelling some paths are attenuated relative to those travelling along other paths. Furthermore the Applicant has appreciated that the differential attenuation is frequency dependent. In fact it has further been appreciated that any cavity or enclosure containing a transmitter and a receiver will inherently have a frequency dependent attenuation of some paths relative to others, even without the introduction of a structure to enhance this deliberately, and that this can be exploited to reduce the impact of the direct path signal.

When viewed from a fourth aspect, the present invention provides a proximity sensor for an electronic device comprising an ultrasonic transmitter and an ultrasonic receiver in a common cavity arranged to determine proximity of an object to a front of said cavity based on a signal received by the ultrasonic receiver, wherein the received signal is a reflection from said object of a signal transmitted from the ultrasonic transmitter wherein the common cavity provides frequency-dependent attenuation to ultrasonic signals transmitted from the ultrasonic transmitter to the ultrasonic receiver with at least one attenuation frequency at which said frequency-dependent attenuation is a maximum within a predetermined frequency range, said ultrasonic signal having at least one dominant frequency substantially equal to said attenuation frequency.

It will be appreciated by those skilled in the art that when viewed from this aspect, the proximity sensor can be arranged to attenuate signals that travel directly from the transmitter to the receiver by engineering the cavity to perform the attenuation inherently. Indirect signals will likely travel entirely different signal paths and are therefore not likely to be subject to the same multipath destructive interference as the direct signals.

When viewed from a fifth aspect, the present invention provides a method of calibrating a proximity sensor for an electronic device comprising an ultrasonic transmitter and an ultrasonic receiver in a common cavity, the method comprising:
- transmitting from the ultrasonic transmitter a plurality of ultrasonic test signals of different frequencies;
- receiving the plurality of ultrasonic test signals at the ultrasonic receiver; and
- determining from the received plurality of ultrasonic test signals an attenuation frequency corresponding to a maximum attenuation of the associated test signal between the transmitter and the receiver; and
- configuring said ultrasonic transmitter to transmit a proximity signal having at least one dominant frequency substantially equal to said attenuation frequency to determine proximity of an object to a front of said cavity based a signal received by the ultrasonic receiver, wherein the received signal is a reflection of said proximity signal from said object.

While the calibration could be carried out during manufacture or quality control processes, in some embodiments the method is carried out during regular operation of the device. This allows the device to be calibrated in situ and allows for fine-tuning should the attenuation frequency shift over time.

The plurality of test signals are used to determine the frequency response of the common cavity for the frequencies of interest. In a set of embodiments, the plurality of test signals are transmitted sequentially. This allows for a systematic, exhaustive test where each frequency is tested individually to increase confidence in the measured attenuation frequency. In a set of embodiments, the method comprises carrying out a frequency sweep.

It will be understood that features disclosed herein with reference to one aspect or embodiment may, where appropriate, also be included in any other aspect or embodiment disclosed herein.

Certain embodiments of the invention will now be described, by way of example only, with reference to the accompanying drawings in which:

FIG. 6 shows a device wherein the ultrasonic receiver is disposed within a channel and the barrier comprises an attenuating fabric in accordance with a yet further embodiment of the invention;

FIG. 7 shows a device similar to that of FIG. 6 but wherein the attenuating fabric covers the opening to the channel in accordance with another embodiment of the invention;

FIG. 8 shows a device wherein multiple discrete signal paths cause direct signals to undergo destructive interference in accordance with an embodiment of the invention; and FIG. 9 shows an exemplary frequency response curve for a particular cavity within a proximity sensor for use in design and calibration of said proximity sensors.

Figure 1:
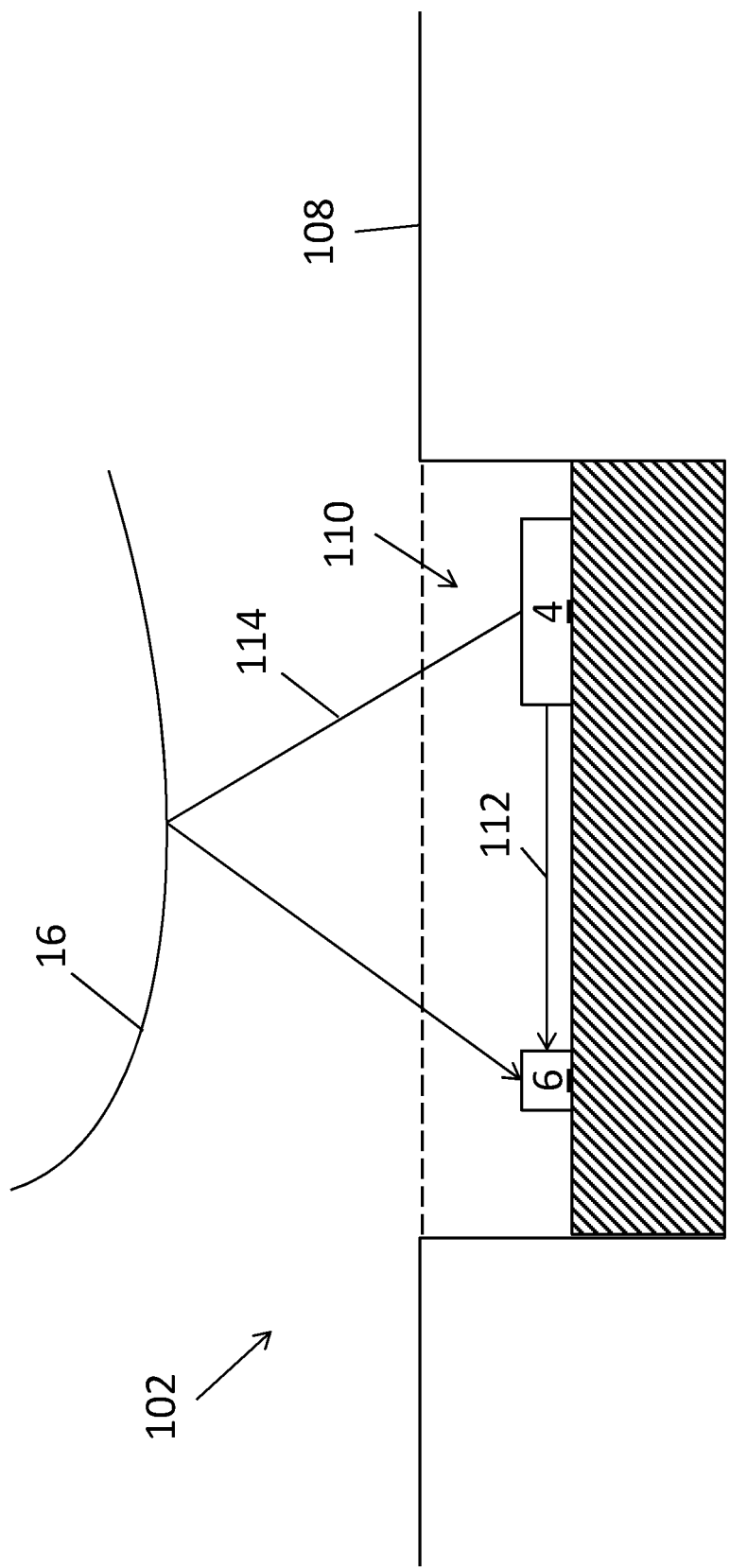
FIG. 1 shows a typical prior art arrangement.

FIG. 1 shows a typical arrangement of a prior art proximity sensor 102 which comprises an ultrasonic transmitter 4 and an ultrasonic receiver 6, both of which are disposed within a cavity 110 recessed from a front surface 108 of the device.

The device 102 is arranged such that ultrasonic signals transmitted by the transmitted 4 are reflected by an object 16 and received by the receiver 6, shown by the indirect path 114. It will be appreciated that there will likely be a number of possible such paths but only one will be shown in each of the Figures for the sake of clarity.

It will also be seen from FIG. 1 that some signals simply travel directly from the transmitter 4 to the receiver 6 without being reflected from the object 16, shown by the direct path 112. These direct signals cause problems as they are difficult to distinguish from the signals that have travelled via the indirect path 114, particularly as they are likely to be stronger than the reflected signals since they have propagated a shorter distance and have not undergone any absorption as a result of (typically imperfect) reflection.

Figure 2A:
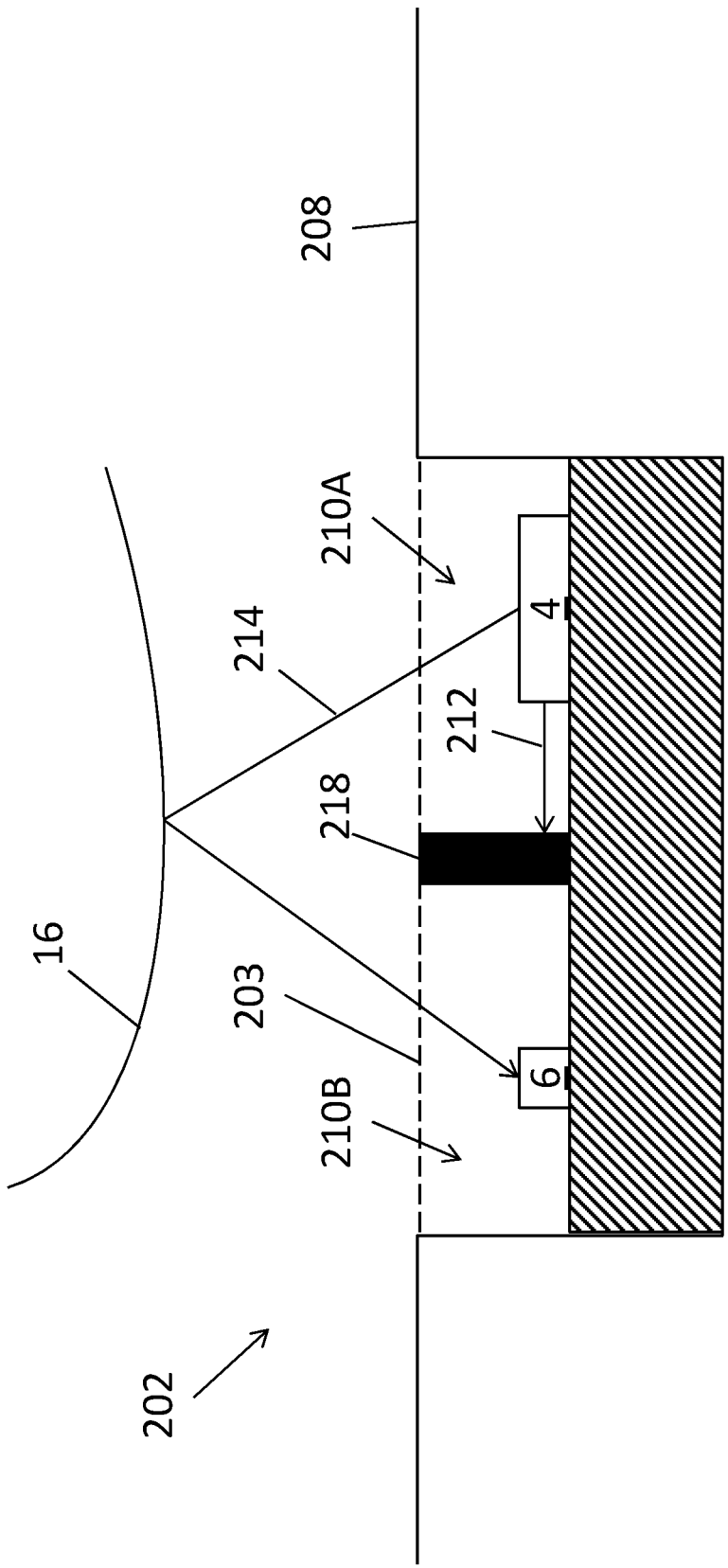
FIGS. 2A and 2B show a diagrammatic cross-sectional view of part of a device with a solid barrier in accordance with an embodiment of the invention.
Figure 2B:
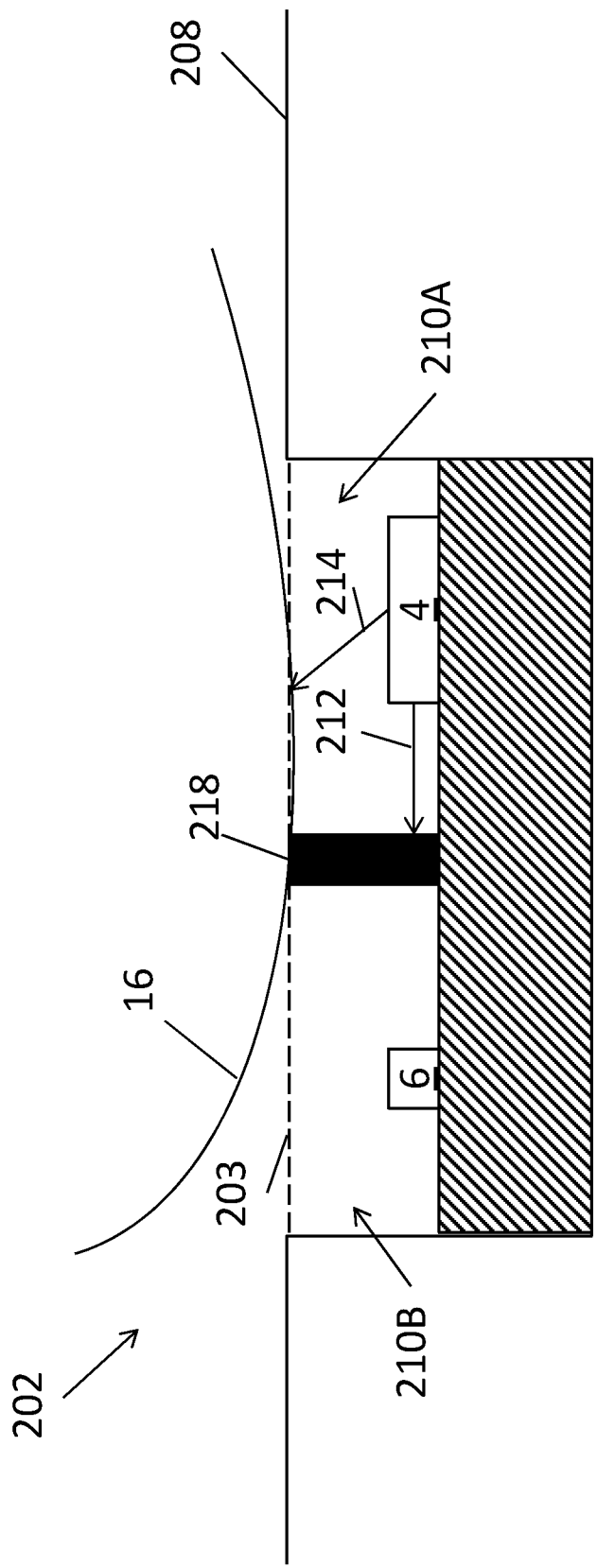

FIGS. 2A and 2B show a device 202 with a solid barrier 218 in accordance with an embodiment of the invention. The solid barrier 218 is positioned between the transmitter 4 and the receiver 6, and extends up to a speaker grille 203 that lies flush with the front surface 208 of the device. The solid barrier 218 divides the cavity into two compartments 210A, 210B in which the transmitter 4 and receiver 6 respectively are located.

The solid barrier 218 effectively prevents ultrasonic signals 212 travelling directly from the transmitter 4 to the receiver 6. However, as can be seen in FIG. 2A, signals that follow the indirect path 214 by exiting the first compartment 210A via the speaker grille 203, reflecting from the object 216 and re-entering the second compartment 210B via the speaker grille 203 are able to travel from the transmitter 4 to the receiver 6 uninhibited by the barrier 218.

FIG. 2B shows the effect of the object 16 being so close to the device 202 that it is in contact with the speaker grille 203. Because the object 16 is in contact with the speaker grille 203, there is no longer any path from the transmitter 4 to the receiver 6 via which ultrasonic signals can travel. The direct path 212 is blocked by the barrier 218 as before, while the indirect path 214 is now blocked by the object 16.

In this scenario, the proximity of the object 16 could be determined by virtue of the fact that no signals are received by the receiver 6, rather than by analysing the time of flight or attenuation characteristics associated with a received signal as would be possible if the object 16 were not blocking the indirect path 214. However, this may not be satisfactory as it may be subject to false detections if a signal from the transmitter does not get reflected from any object.

Figure 3A:
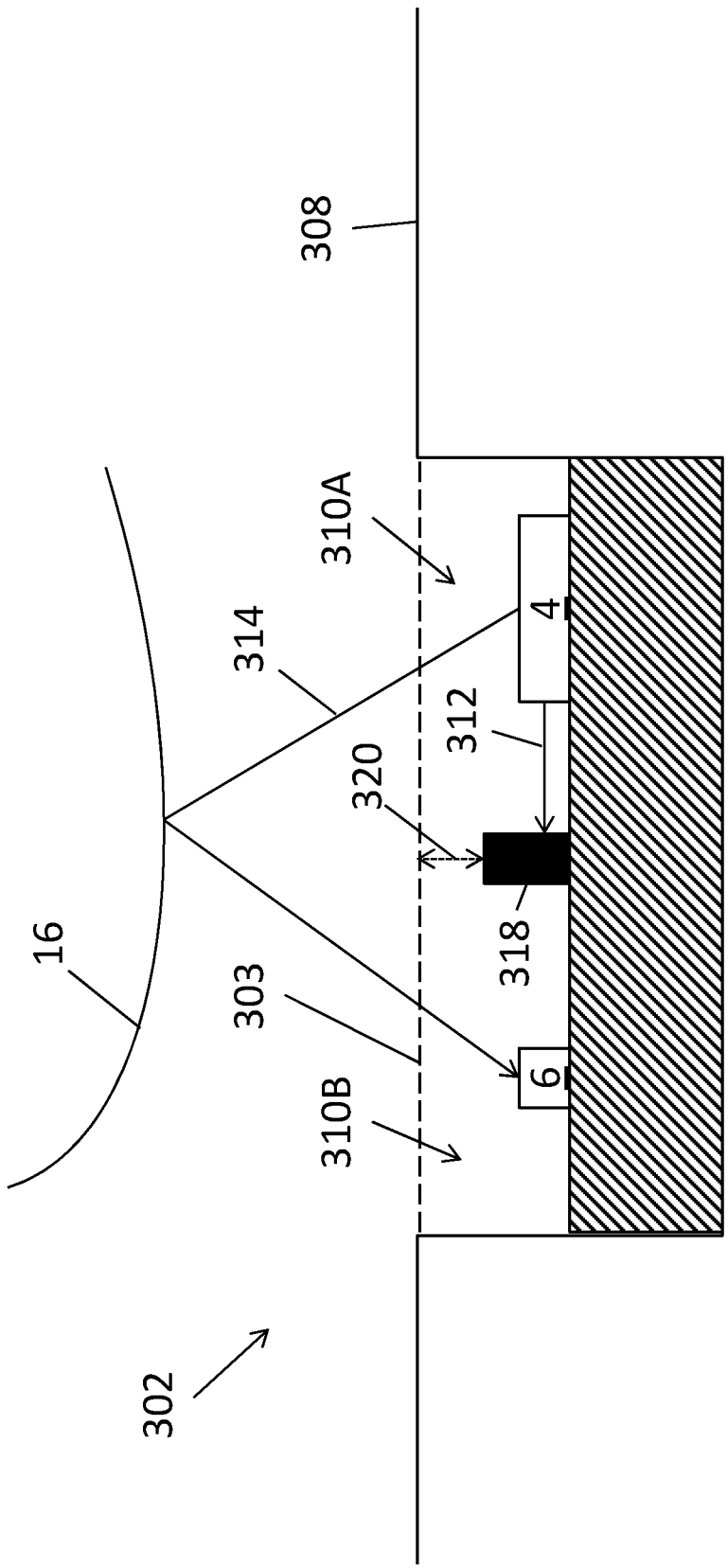
FIGS. 3A and 3B show a device with a gap between the barrier and the front surface of the device in accordance with a further embodiment of the invention.
Figure 3B:
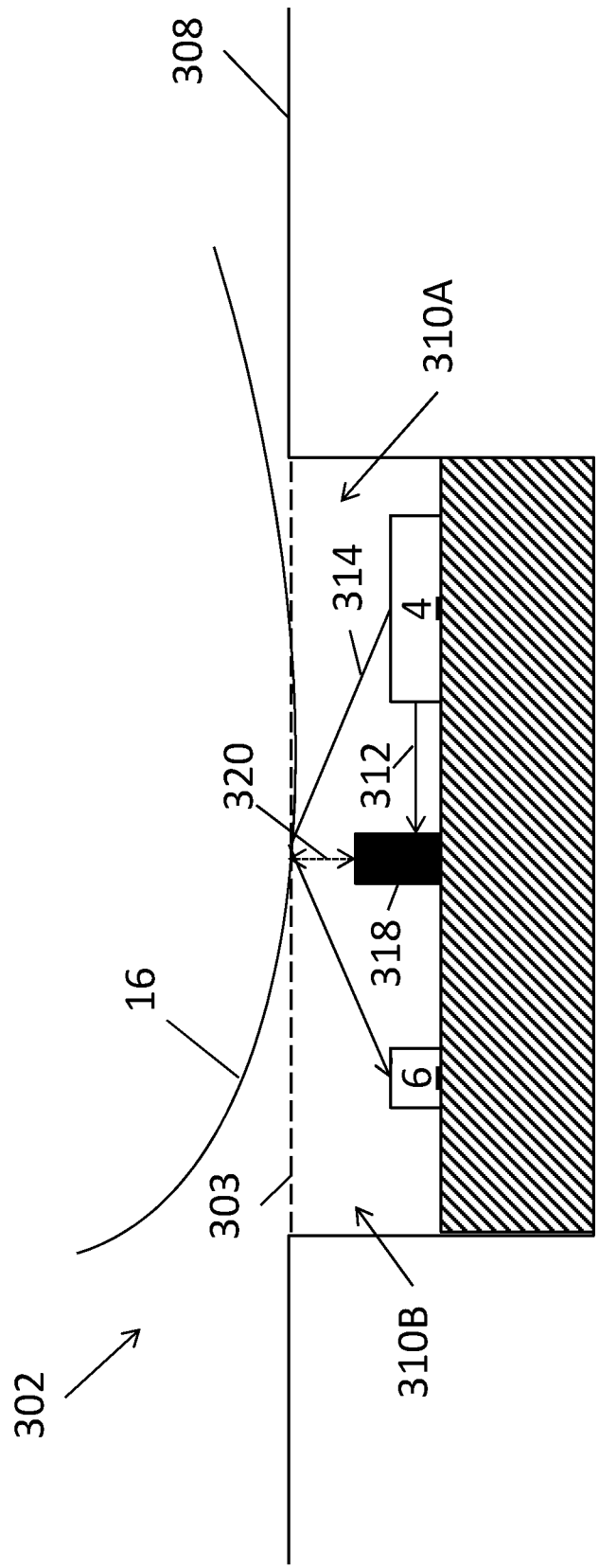

FIGS. 3A and 3B show an alternative embodiment. In this embodiment, the proximity sensor arrangement 302 has a gap 320 between the barrier 318 and the front surface 308 of the device. Unlike the embodiment shown in FIGS. 2A and 2B, this prevents the object 16 completely blocking ultrasonic signals travelling from the transmitter 4 to the receiver 6.

The barrier 318 extends towards the speaker grille 303 which is flush with the front surface 308 of the device, but does not extend all of the way to the grille 303, instead leaving a gap 320 therebetween. While FIG. 3A shows a similar mode of operation to the previous embodiment as illustrated in FIG. 2A, the technical benefit of having the gap 320 between the barrier 318 and the grille 303 is best observed by comparing FIG. 3B to FIG. 2B.

As can be seen in FIG. 3B, while the object 16 is in contact with the front surface 308 of the device, the gap 320 ensures that an indirect path 314 is still available for ultrasonic signals to propagate from the transmitter 4 to the receiver 6, bypassing the barrier 318. This advantageously allows for the device to determine the proximity of the object 16 using techniques such as time of flight analysis or monitoring the attenuation of the ultrasonic signals even when the object 16 is largely blocking the grille 303.

Figure 4:
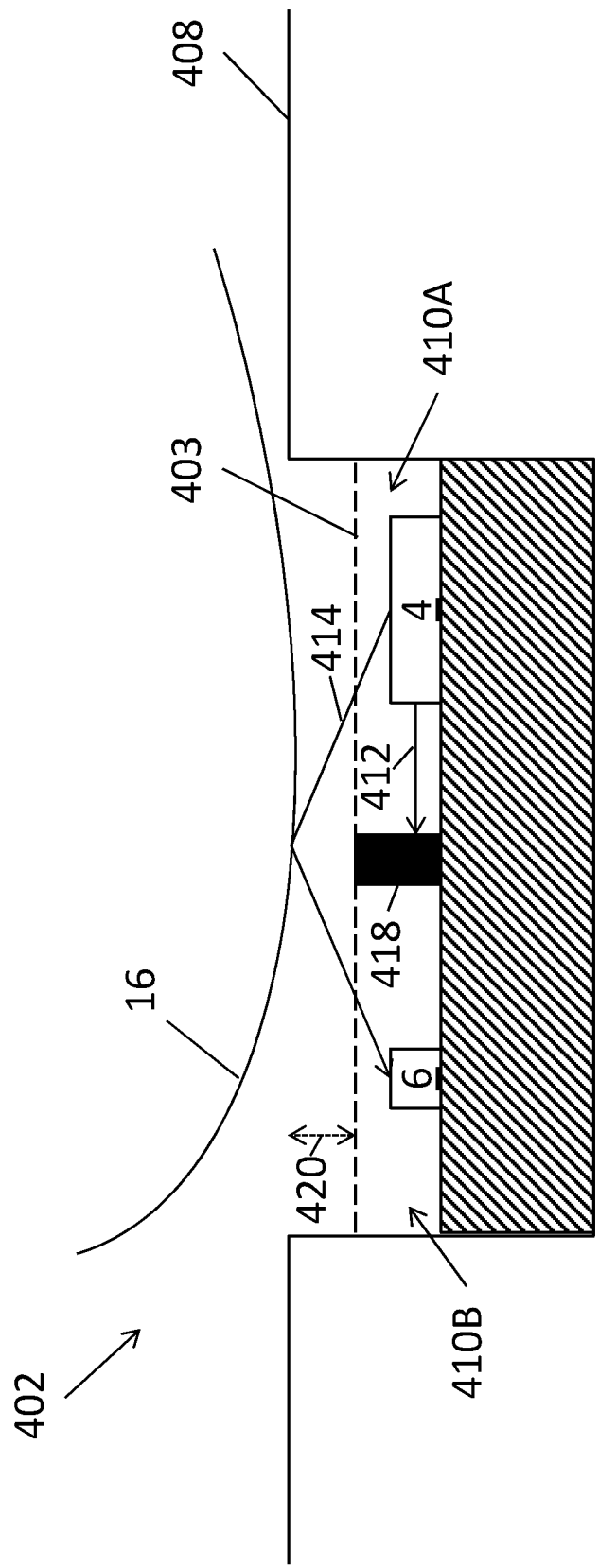
FIG. 4 shows a device provided with a gap between a speaker grille and the barrier in accordance with another embodiment of the invention.

FIG. 4 shows a device 402 provided with a gap 420 between a speaker grille 403 and the barrier 418 in accordance with another embodiment of the invention. Similarly to the embodiment described above with reference to FIGS. 3A and 3B, the embodiment shown in FIG. 4 also helps to ensure that reflected signals are able to reach the receiver 6 even when the object 16 is in very close proximity to the front surface 408 of the device 402. As before, this is because an indirect path 414 is available even when the object 16 is very close to or touching the front surface 408 of the device 402. The barrier 418 prevents ultrasonic signals following the direct path 412.

However, rather than the gap 420 existing between the barrier 418 and the grille 403 as previously, in this embodiment the gap 420 exists between the grille 403 and the front surface 408. This is achieved by having the grille 403 recessed from the front surface 408. While small objects could feasibly fill this space and block either or both of the compartments 410A, 410B, it will be appreciated that the surfaces intended to be detected such as user's cheeks, pockets, or a table etc. will typically be far larger than the small space into which the proximity sensor arrangement is recessed.

Figure 5:
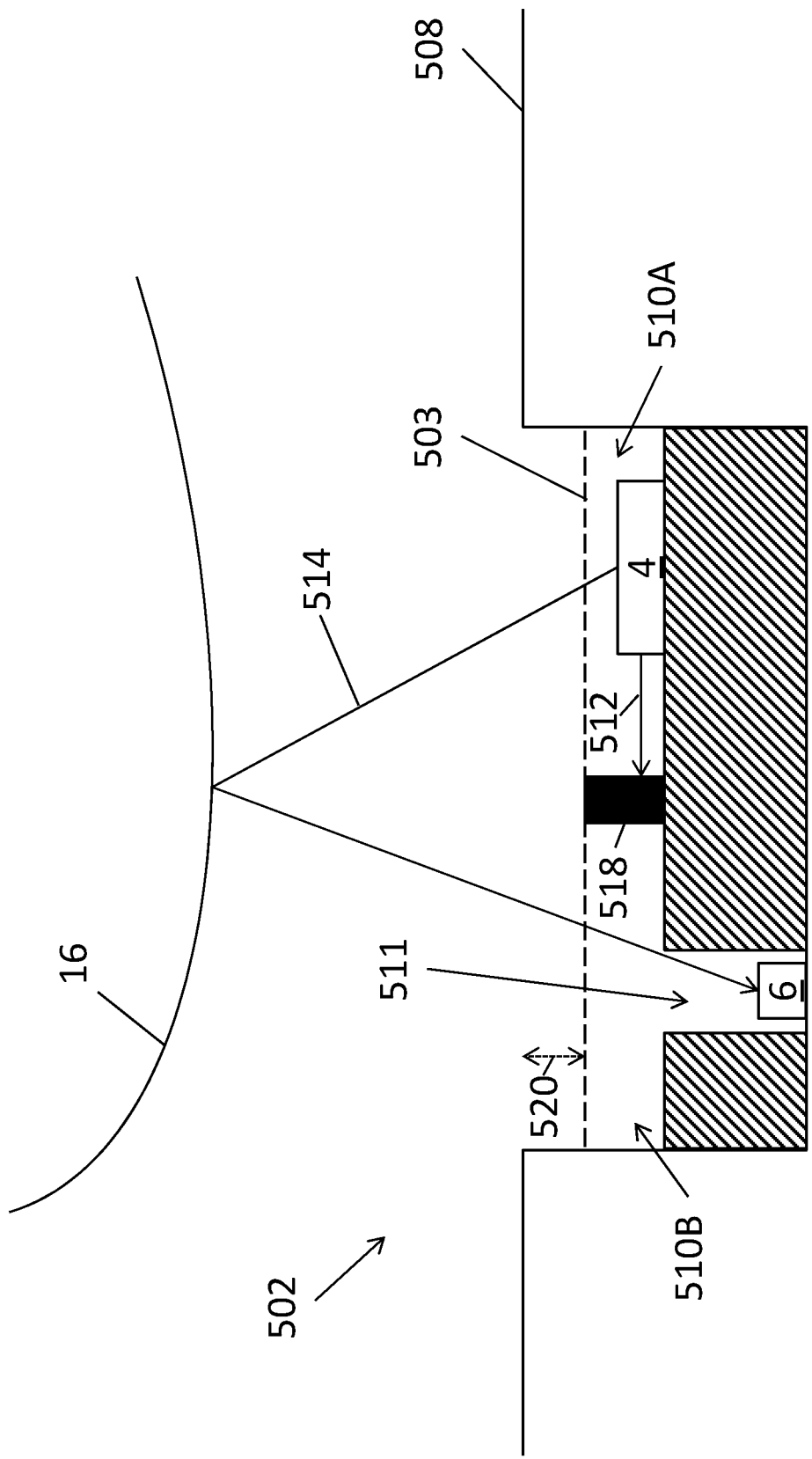
FIG. 5 shows a device wherein the ultrasonic receiver is disposed within a channel in accordance with a further embodiment of the invention.

FIG. 5 shows a device 502 wherein the ultrasonic receiver 4 is disposed within a channel 511 in accordance with a further embodiment of the invention. Similarly to the embodiment described with reference to FIG. 4, a gap 520 exists between the grille 503 and the front surface 508, and the barrier 518 partitions the transmitter 4 and receiver 6 into separate compartments 510A, 510B respectively.

In this particular embodiment, rather than the transmitter 4 and receiver 6 being recessed from the front surface 508 by the same amount, the receiver 6 is located within a channel 511 and is thus recessed from the front surface 508 by a greater distance than the transmitter 4. This further reduces the ability for signals 512 from the transmitter 4 to reach the receiver 6 directly from the side, while still allowing signals reflected from the object 16 to reach the receiver 6.

FIG. 6 shows a device in accordance with a yet further embodiment of the invention. While the embodiments of the present invention shown previously have used a solid barrier to reduce the effectiveness of the direct signal path, in the embodiment of FIG. 6 the barrier comprises an attenuating fabric member 618.

A signal 612A, 612B travelling directly from the transmitter 4 to the receiver 6 without exiting the cavity 610 will largely need to pass through the fabric member 618 which will cause significant attenuation compared to signals travelling via the indirect path 614 which are unhindered by the member 618 as they do not pass through it, instead travelling out of the cavity 610 via the grille 603, before being reflected back into the cavity 610 by the object 16. This therefore increases the SNR of the desired, indirect signals, as the "noise", i.e. the direct signals travelling via the path 612A, 612B is reduced while the strength of the signals travelling via the indirect path 614 is not. Moreover because the fabric member largely absorbs sounds rather than reflecting them, there is less tendency for multi-path interference to be generated.

FIG. 7 shows a device 702 similar to that of FIG. 6 but wherein the attenuating fabric member 718 covers the opening to the channel 711.

Since the fabric member 718 has an aspect ratio greater than one (i.e. it is wider than it is tall), signals travelling via the direct path (i.e. signals that are oblique to the upper surface of the member 718) travel through a greater amount of attenuating fabric than signals travelling via an indirect path (i.e. signals that are normal to the upper surface of the member 718), causing said direct signals to be attenuated by a greater amount. As discussed above, this increases the SNR of the desired, indirect signals, as the "noise", i.e. the direct signals travelling via paths 612A, 612B is reduced significantly while the strength of the signals travelling via the indirect path 614 is reduced by a lesser amount, having the net effect of increasing the ratio between the signal and the noise.

FIG. 8 shows a device 802 wherein multiple discrete signal paths 812A, 812B cause direct signals to undergo destructive interference in accordance with an embodiment of the invention. A signal travelling directly from the transmitter 4 to the receiver 6 can, in this embodiment, reach the receiver via either of two possible paths 812A, 812B which are defined by two side-channels.

The paths 812A, 812B differ in length by an odd integer multiple of half of the dominant wavelength present in ultrasonic signals transmitter by the transmitter 4. This causes destructive interference to occur at the node 814 where the two paths 812A, 812B meet in front of the receiver 6.

However, signals that travel via an indirect path (not shown in this Figure) by exiting the device 802 via the speaker grille 803 are unlikely to have such a relationship between the distances travelled by indirect signals entering the receiver via either side-channel and will thus not undergo this same destructive interference, rendering them easier to distinguish from the direct signals.

In an alternative embodiment, the positions of the transmitter 4 and receiver 6 may be exchanged, while still leading to beneficial destructive interference.

FIG. 9 shows an exemplary frequency response curve for a particular cavity within a proximity sensor for use in design and calibration of said proximity sensors. The Applicant has appreciated that each proximity sensor cavity has a characteristic frequency response associated therewith. While these frequency responses may, at least in part, be chosen during design, there are often other factors including manufacturing tolerances that may cause this to vary from the desired response.

The frequency response plotted in the graph of FIG. 9 shows the relationship between the magnitude |A| of signals received by the receiver 4 directly from the transmitter 6, and the frequency f of said signals. As can be seen from the graph, there exists at least one global minimum frequency 900. If signals are transmitted by the transmitter 6 at the frequency corresponding to this minimum 900, there will be a maximal attenuation of the direct signals by the cavity itself. This can be used as a feature alone, but can also be used to enhance the direct signal cancelling methods outlined in the embodiments described above.

While this minimum point 900 may be found and calibrated for during manufacture, it may shift during operation of the device, possibly due to external factors such as temperature or small particles entering the proximity sensor cavity. An algorithm may be run on the device e.g. on a processor that can occasionally perform a frequency sweep through an appropriate frequency range in order to determine the current minimum point 900 and ensure the device is calibrated such that the transmitter uses this frequency.

Thus it will be seen that a proximity sensor that advantageously reduces the impact of direct signal path between an ultrasonic transmitter and receiver has been described herein. Although particular embodiments have been described in detail, it will be appreciated by those skilled in the art that many variations and modifications are possible using the principles of the invention set out herein.

The invention claimed is:

1. An electronic device having a front surface and including an ultrasonic proximity sensor arrangement comprising:
   an ultrasonic transmitter recessed from a front surface of the device;
   an ultrasonic receiver recessed from the front surface of the device wherein the ultrasonic receiver is recessed further from the front surface of the device than the ultrasonic transmitter, forming a channel in which the ultrasonic receiver is positioned, wherein the channel comprises two discrete signal paths with first and second different lengths, the difference between the first and second lengths being substantially equal to an odd integer multiple of a wavelength of a signal transmitted from the ultrasonic transmitter; and
   an acoustic barrier extending between the transmitter and receiver in the direction of the front surface of the device so as to block a direct path comprising ultrasonic signals travelling directly from the transmitter to the receiver,
   the ultrasonic proximity sensor arrangement being arranged to determine proximity of an object to said front surface based on an indirect signal received by the ultrasonic receiver, wherein the received indirect signal is a reflection from said object of a signal transmitted from the ultrasonic transmitter.

2. The device as claimed in claim 1 further comprising a gap between the front surface of the device and the acoustic barrier.

3. The device as claimed in claim 1, wherein the acoustic barrier extends to the front surface of the device.

4. The device as claimed in claim 1, wherein the ultrasonic proximity sensor arrangement is arranged to determine proximity of an object using a measured time of flight between the signal transmitted from the ultrasonic transmitter and the signal received by the ultrasonic receiver after reflection from said object.

5. The device as claimed in claim 1, wherein the ultrasonic proximity sensor arrangement is arranged to determine proximity of an object using a difference between a signal strength of the transmitted signal and a measured signal strength of the received signal.

6. The device as claimed in claim 1, wherein the barrier comprises a solid barrier.

7. The device as claimed in claim 1, wherein the acoustic barrier comprises an acoustically attenuating material.

8. The device as claimed in claim 7, wherein said reflected signals have a shorter path through the material than signals that travel from the transmitter to the receiver without being reflected from said object.

9. The device as claimed in claim 1, wherein the acoustic barrier comprises an acoustically absorbent material.

10. The device as claimed in claim 1, wherein the transmitter is recessed further from the front surface of the device than the receiver, forming a channel in which the ultrasonic transmitter is positioned.

11. The device as claimed in claim 1, wherein the channel comprises two discrete signal paths with first and second different lengths, the difference between the first and second lengths being chosen to attenuate direct signals.

12. The device as claimed in claim 1, wherein the proximity sensor comprises an acoustically porous layer positioned above the ultrasonic transmitter and the ultrasonic receiver.

13. The device as claimed in claim 12, wherein the acoustically porous layer is flush with the front surface of the device.

14. The device as claimed in claim 12, wherein the acoustically porous layer is recessed from the front surface of the device.

15. The device as claimed in claim 1, wherein the transmitter and receiver are positioned in first and second compartments respectively.

16. An electronic device having a front surface and including an ultrasonic proximity sensor arrangement comprising:
   an ultrasonic transmitter recessed from the front surface;
   an ultrasonic receiver recessed from the front surface;
   the ultrasonic proximity sensor arrangement being arranged to determine proximity of an object to said front surface based on a signal received by the ultrasonic receiver, wherein the received signal is a reflection from said object of a signal transmitted from the ultrasonic transmitter;
   the ultrasonic proximity sensor arrangement further comprising a structure disposed in front of the receiver defining at least first and second discrete signal paths having different path lengths such that signals travelling from the transmitter without passing the front surface to the receiver via the first and second paths undergo a destructive interference which is greater than a destructive interference undergone by signals travelling from the transmitter to the receiver after reflection from the object.

17. An electronic device having a front surface and including an ultrasonic proximity sensor arrangement comprising:
   an ultrasonic transmitter recessed from the front surface;
   an ultrasonic receiver recessed from the front surface;

the ultrasonic proximity sensor arrangement being arranged to determine proximity of an object to said front surface based on a signal received by the ultrasonic receiver, wherein the received signal is a reflection from said object of a signal transmitted from the ultrasonic transmitter;

the ultrasonic proximity sensor arrangement further comprising a structure disposed in front of the transmitter defining at least first and second discrete signal paths having different path lengths such that signals travelling from the transmitter without passing the front surface to the receiver via the first and second paths undergo a destructive interference which is greater than a destructive interference undergone by signals travelling from the transmitter to the receiver after reflection from the object.

18. The device as claimed in claim 16 wherein the ultrasonic transmitter is arranged to transmit ultrasonic signals having at least one dominant wavelength and wherein the length of the first path differs from the length of the second path by an odd integer multiple of half of said dominant wavelength.

19. A proximity sensor for an electronic device comprising an ultrasonic transmitter and an ultrasonic receiver in a common cavity arranged to determine proximity of an object to a front of said cavity based on a signal received by the ultrasonic receiver, wherein the received signal is a reflection from said object of a signal transmitted from the ultrasonic transmitter wherein the common cavity provides frequency-dependent attenuation to ultrasonic signals transmitted from the ultrasonic transmitter to the ultrasonic receiver with at least one attenuation frequency at which said frequency-dependent attenuation is a maximum within a predetermined frequency range, said ultrasonic signal having at least one dominant frequency substantially equal to said attenuation frequency.

20. A method of calibrating a proximity sensor for an electronic device comprising an ultrasonic transmitter and an ultrasonic receiver in a common cavity, the method comprising:
  transmitting from the ultrasonic transmitter a plurality of ultrasonic test signals of different frequencies;
  receiving the plurality of ultrasonic test signals at the ultrasonic receiver; and
  determining from the received plurality of ultrasonic test signals an attenuation frequency corresponding to a maximum attenuation of the associated test signal between the transmitter and the receiver; and
  configuring said ultrasonic transmitter to transmit a proximity signal having at least one dominant frequency substantially equal to said attenuation frequency to determine proximity of an object to a front of said cavity based a signal received by the ultrasonic receiver, wherein the received signal is a reflection of said proximity signal from said object.

21. The method of claim 20 carried out during regular operation of the device.

22. The method of claim 20 wherein the plurality of test signals are transmitted sequentially.

23. The method as claimed in claim 20 comprising carrying out a frequency sweep.

* * * * *